United States Patent
Cheong et al.

(10) Patent No.: US 6,998,634 B2
(45) Date of Patent: Feb. 14, 2006

(54) MEMORY DEVICE UTILIZING VERTICAL NANOTUBES

(75) Inventors: Byoung-ho Cheong, Goyang (KR); Won-bong Choi, Yongin (KR)

(73) Assignee: Samsung Electronics Co., Ltd., Suwon-si (KR)

(*) Notice: Subject to any disclaimer, the term of this patent is extended or adjusted under 35 U.S.C. 154(b) by 149 days.

(21) Appl. No.: 10/747,438

(22) Filed: Dec. 30, 2003

(65) Prior Publication Data
US 2004/0149979 A1  Aug. 5, 2004

(30) Foreign Application Priority Data
Dec. 30, 2002  (KR) .................. 10-2002-0087158

(51) Int. Cl.
*H01L 29/06* (2006.01)

(52) U.S. Cl. .................. 257/9; 257/12; 257/27; 257/30; 257/315; 257/324; 438/962

(58) Field of Classification Search .......... 257/12, 257/27, 30, 315, 324; 438/962

See application file for complete search history.

(56) References Cited

U.S. PATENT DOCUMENTS 6,566,704 B1    5/2003   Choi et al.
6,707,098 B1 *  3/2004   Hofmann et al. ........... 257/324

FOREIGN PATENT DOCUMENTS

JP    2002-110977    4/2002
KR    2001-0017411   3/2001

* cited by examiner

Primary Examiner—Mai-Huong Tran
(74) Attorney, Agent, or Firm—Lee & Morse, P.C.

(57) ABSTRACT

A memory device using vertical nanotubes includes an array of first electrodes arranged in strips in a first direction, a dielectric layer deposited on the array of first electrodes, the dielectric layer having a plurality of holes arranged therein, an array of nanotubes for emitting electrons, the array of nanotubes contacting the array of first electrodes and vertically growing through the plurality of holes in the dielectric layer, an array of second electrodes arranged in strips in a second direction on the dielectric layer, the array of second electrodes contacting the array of nanotubes, wherein the second direction is perpendicular to the first direction, a memory cell positioned on the array of second electrodes for trapping electrons emitted from the array of nanotubes, and a gate electrode deposited on an upper surface of the memory cell for forming an electric field around the array of nanotubes.

17 Claims, 5 Drawing Sheets

MEMORY DEVICE UTILIZING VERTICAL NANOTUBES

BACKGROUND OF THE INVENTION

1. Field of the Invention

The present invention relates to a memory device. More particularly, the present invention relates to a memory device utilizing vertical nanotubes.

2. Description of the Related Art

Semiconductor nonvolatile memory devices are basically comprised of a transistor, which serves as a switch for securing a current path, and a floating gate, which preserves electric charges between gates. To provide a high current flow in a transistor, the transistor must have a high transconductance property. Accordingly, there is a recent trend to use a metal-oxide-semiconductor field effect transistor (MOSFET) with a high transconductance property as a switch in a semiconductor memory device. MOSFETs are basically comprised of a control gate, formed of doped polycrystalline silicon, and a source region and a drain region, which are formed of doped crystalline silicon.

Under a certain voltage condition, the transconductance of a MOSFET is inversely proportional to a length of a channel and a thickness of a gate oxide film and directly proportional to a surface mobility, a permittivity of the gate oxide film, and a width of the channel. Since the surface mobility and the permittivity of the gate oxide film are predetermined by the materials used, i.e., silicon for a wafer, silicon oxide for the gate oxide film, etc., a high transconductance can only be secured by increasing a ratio of the width to the length of the channel or by decreasing the thickness of the gate oxide film.

To manufacture highly integrated memory devices, the size of a MOSFET must be reduced by downsizing the control gate, the source region, and the drain region. This downsizing creates several problems. For example, a reduction in the size of the control gate causes a reduction in the cross-sectional area of the control gate, such that a large electrical resistance may occur in the MOSFET. A reduction in the size of the source and drain regions causes a reduction in the thicknesses of the regions, i.e., in their junction depths, and accordingly causes a larger electrical resistance. In addition, a reduction in the distance between the source and drain regions causes a punch-through to occur where a depletion layer in the source region contacts a depletion layer in the drain regions, thereby making it impossible to control current. Such a reduction in the size of the memory device reduces the width of a channel to 30 nm or less and accordingly disrupts a smooth flow of current thereby causing the memory device to malfunction. Since conventional memory devices having silicon MOSFETs have the above-described problems when integration density increases, there is a limit in achieving highly integrated memory devices.

SUMMARY OF THE INVENTION

The present invention provides a highly integrated memory device having a large memory capacity by using vertically-grown carbon nanotubes.

According to an aspect of the present invention, there is provided a memory device using vertical nanotubes, including an array of first electrodes arranged in strips in a first direction, a dielectric layer deposited on the array of first electrodes, the dielectric layer having a plurality of holes arranged therein, an array of nanotubes for emitting electrons, the array of nanotubes contacting the array of first electrodes and vertically growing through the plurality of holes in the dielectric layer, an array of second electrodes arranged in strips in a second direction on the dielectric layer, the array of second electrodes contacting the array of nanotubes, wherein the second direction is perpendicular to the first direction, a memory cell positioned on the array of second electrodes for trapping electrons emitted from the array of nanotubes, and a gate electrode deposited on an upper surface of the memory cell for forming an electric field around the array of nanotubes.

Preferably, the first electrodes are source electrodes, and the second electrodes are drain electrodes. Preferably, the nanotubes are carbon nanotubes.

The memory cell preferably includes a first insulation film deposited on the array of second electrodes, a second insulation film formed below the gate electrode, and a charge storage film interposed between the first insulation film and the second insulation film for trapping charges emitted from the array of nanotubes. The first insulation film and the second insulation film are preferably formed of silicon oxide. The charge storage film may be formed of one of silicon and silicon nitride. Alternately, the charge storage film may be formed of silicon nano quantum dots having a size of several nanometers. The gate electrode may be formed of either a metal or a semiconductor.

The plurality of holes are preferably arranged in a pattern to form either a hexagonal honeycomb shape or a square shape.

Preferably, a length of each of the nanotubes is 5 to 10 times greater than a width of each of the second electrodes and a width of the gate electrode is 5 to 10 times wider than a width of the second electrodes. Preferably, the memory cell has a thickness of about 30 nm.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
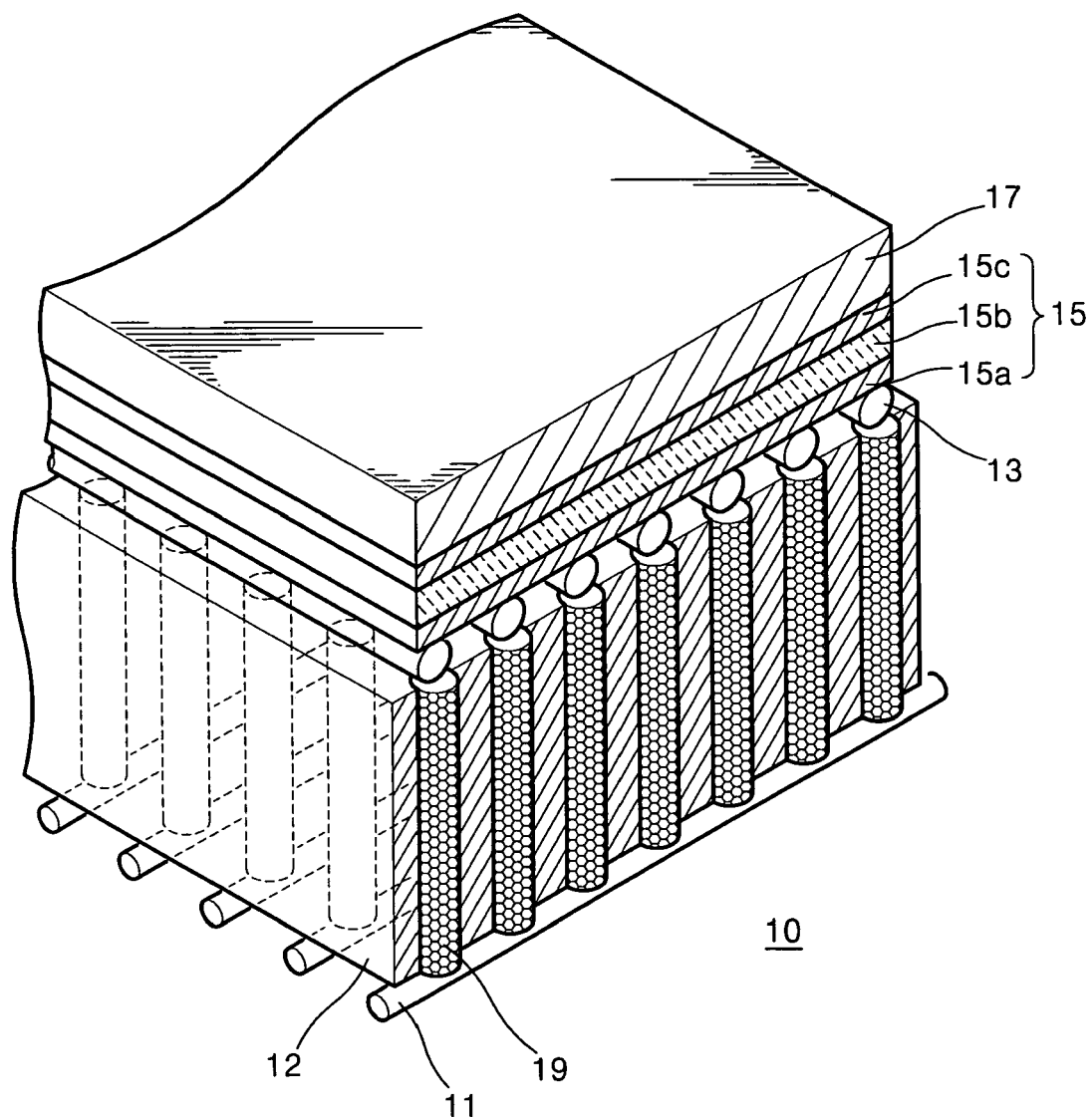
FIG. 1 illustrates a perspective view of a memory device according to a first embodiment of the present invention.

Korean Patent Application No. 2002-87158, filed on Dec. 30, 2002, and entitled: "Memory Device Utilizing Vertical Nanotubes," is incorporated by reference herein in its entirety.

A memory device using nanotubes according to the present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

FIG. 1 illustrates a perspective view of a memory device 10 according to a first embodiment of the present invention. Referring to FIG. 1, the memory device 10 includes an array of source electrodes 11, a dielectric layer 12, an array of carbon nanotubes 19, an array of drain electrodes 13, a memory cell 15, and a gate electrode 17. The source electrodes 11 are arrayed in a first direction. The dielectric layer 12 is formed on the array of source electrodes 11 and has a plurality of nano-holes arranged in a pattern. The array of carbon nanotubes 19 is vertically grown from the array of source electrodes 11 through the nano-holes of the dielectric layer 12. The drain electrodes 13 are arrayed in a second direction, which is perpendicular to the first direction, i.e., the direction in which the source electrodes 11 are arrayed, so as to cross the carbon nanotubes 19 at right angles. The memory cell 15 contacts upper surfaces of the drain electrodes 13. The gate electrode 17 is deposited on the memory cell 15.

The source electrode array and the drain electrode array are formed using a metal deposition technique. More specifically, titanium (Ti) is deposited to a thickness of about 10 nm on a substrate, gold (Au) is deposited to a thickness of about 50 nm on the titanium film, and the resulting substrate is partially lifted off to obtain the source and drain electrodes 11 and 13.

The dielectric layer 12 is generally formed using an anodic aluminum oxide (AAO) process. In an AAO process, while aluminum is being anodized and turned into alumina, a plurality of nano-holes are formed in a material layer. The nano-holes are generally arranged in a pattern to form a hexagonal honeycomb shape, but may be arranged in a square shape by using a mask or the like. The nano-holes shown in FIG. 1 are arranged in a square shape.

The carbon nanotubes 19 are vertically grown through the nano-holes of the dielectric layer 12 using a chemical vapor deposition (CVD) method. Using the CVD method, multi-wall nanotubes are formed. The multi-wall nanotubes can be of a metal type or a semiconducting type depending on the conditions of the CVD method. The carbon nanotubes 19 serve as channels through which electrons move. Nanotubes of a material other than carbon can be used if the resulting nanotubes have similar properties to the carbon nanotubes 19.

The memory cell 15 includes a first oxide film 15a, a nitride film 15b, and a second oxide film 15c that are sequentially stacked. The first and second oxide films 15a and 15c serve as insulation films and are usually formed of silicon oxide ($SiO_2$). The nitride film 15b, which serves as a charge storage film, is generally formed of silicon nitride ($Si_3N_4$). The nitride film 15b can store information by capturing electrons, which are moved by the potential of an electric field, because the nitride film 15b has a structure in which dangling bonding can occur. The memory cell 15 can be deposited to a thickness of several tens of nanometers, preferably about 30 nm, using a CVD method.

The gate electrode 17 is formed of a metal or a semiconductor. A predetermined voltage is applied to the gate electrode 17 to control the flow of electrons that move through the carbon nanotubes 19. When the voltage is applied to the gate electrode 17, an electric field is formed under the gate electrode 17, and electrons are emitted from the source electrodes 11 to the drain electrodes 13 via the carbon nanotubes 19 in a Fowler-Nordheim manner and move in a direction opposite to the direction of the electric field toward the memory cell 15. The electrons are stored in the nitride film 15b. The number of stored electrons can be controlled by varying the intensity of the voltage applied to the gate electrode 17.

Figure 2:
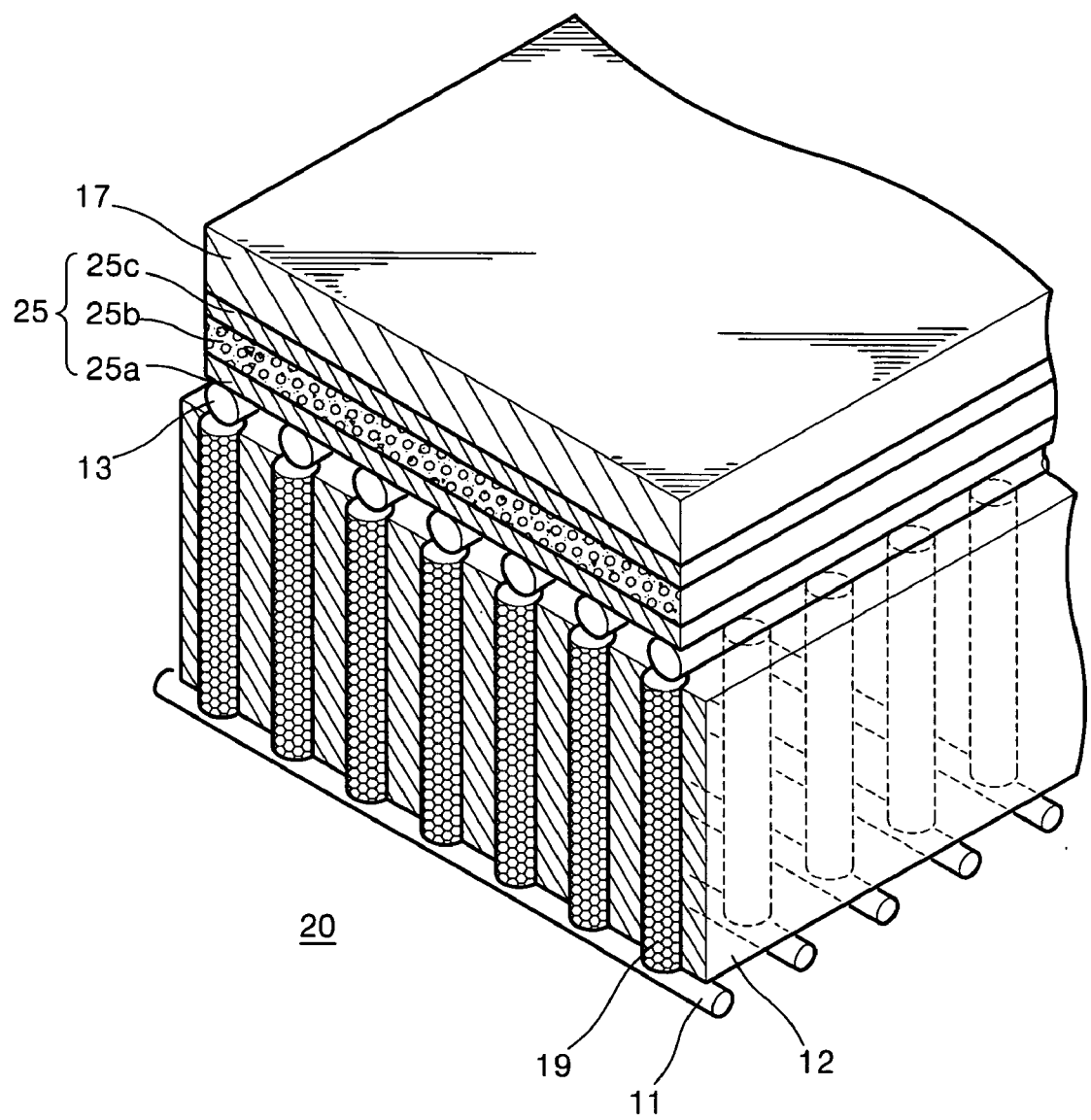
FIG. 2 illustrates a perspective view of a memory device according to a second embodiment of the present invention.

FIG. 2 illustrates a perspective view of a memory device 20 according to a second embodiment of the present invention. Referring to FIG. 2, the memory device 20 is the same as the memory device 10 of FIG. 1 except that a memory cell in the second embodiment has a different structure from the memory cell of the first embodiment. A memory cell 25 in the memory device 20 includes a charge (electron) storage film 25b formed of nano quantum dots between first and second insulation films 25a and 25c. The first and second insulation films 25a and 25c can be formed of an oxide, for example, silicon oxide.

Here, the nano quantum dots are usually formed of silicon using a physical or chemical technique. The physical technique may be a vacuum synthesis technique, a gas-phase synthesis technique, a condensed phase synthesis technique, a fast deposition technique using an ionized cluster beam, a consolidation technique, a fast milling technique, a mixalloy processing technique, a deposition technique, or a sol-gel technique. The chemical technique includes a general CVD technique and a technique of coating a core material with a different material.

The nano quantum dots are formed to be several nanometers in size so that they can easily trap several to several tens of electrons. As the sizes of nano quantum dots decrease, the number of electrons trapped in the nano quantum dots may decrease. Accordingly, the voltage applied to the gate electrode 17 may become lower.

Figure 3:
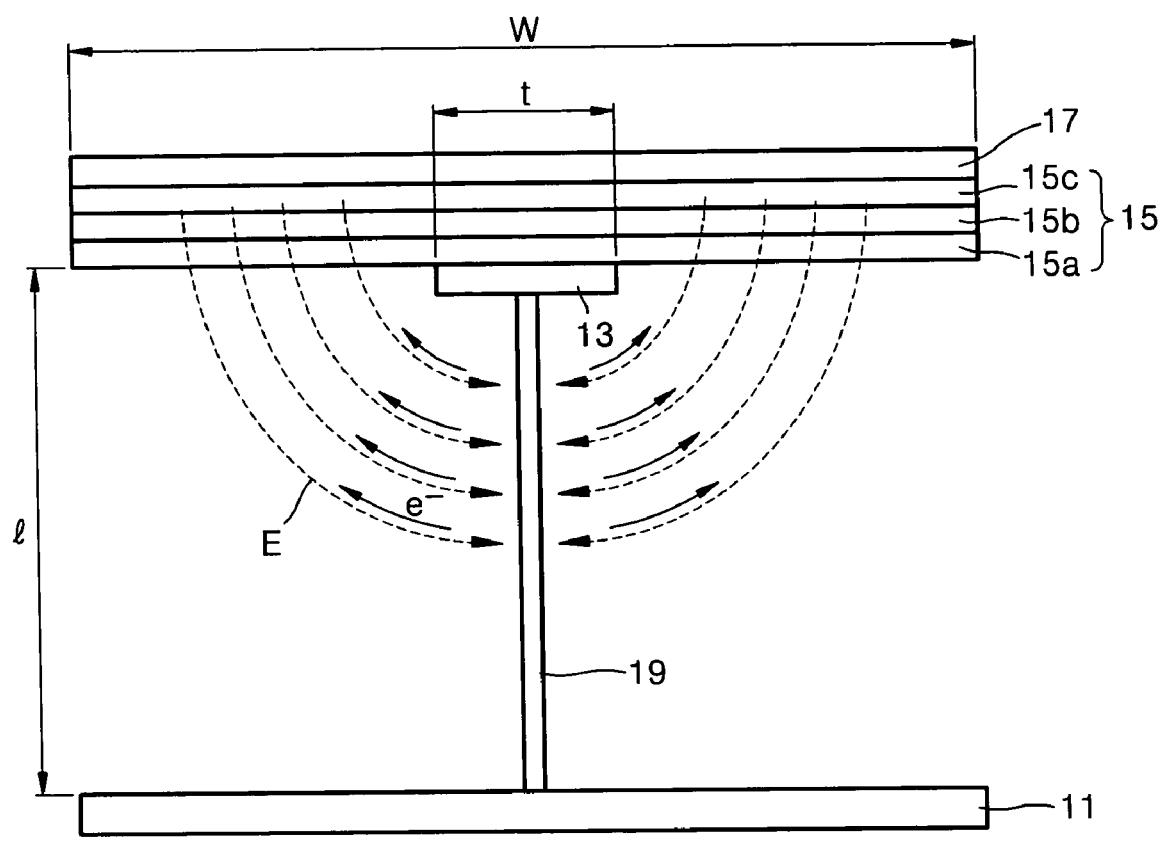
FIG. 3 is a conceptual diagram for illustrating a principle in which electrons are trapped in a memory cell in the memory device according to the first embodiment of the present invention of FIG. 1.

FIG. 3 is a conceptual diagram for illustrating a principle in which electrons are trapped in the memory cell 15 of the memory device according to the first embodiment of the present invention as shown in FIG. 1. Referring to FIG. 3, when a predetermined voltage is applied between the source and drain electrodes 11 and 13, electrons move to the drain electrodes 13 along the carbon nanotubes 19. When a positive voltage greater than the voltage applied between the source and drain electrodes 11 and 13 is applied to the gate electrode 17, an electric field E is emitted from the gate electrode 17 in the directions indicated by dotted lines. When the voltage applied to the gate electrode 17 becomes equal to or greater than a threshold voltage $V_{th}$, some electrons moving toward the drain electrodes 13 along the carbon nanotubes 19 move in a direction opposite to the direction of the electric field E and are directed toward the memory cell 15. As the voltage applied to the gate electrode 17 increases, the number of electrons moving in a direction opposite to the direction of the electric field E increases, and the number of electrons trapped in the nitride film 15b of the memory cell 15 increases. The trapping of electrons in the memory cell 15 is called a programming process.

An erasing process is achieved by emitting the electrons stored in the nitride film 15b of the memory cell 15 by reversing the original direction of the electron field E by applying to the gate electrode 17 a voltage having an opposite polarity to the voltage applied during programming.

The memory devices according to the above-described embodiments of the present invention can achieve a maximum electron storage efficiency by controlling a width (w) of a gate electrode and a width (t) of the drain electrodes with respect to the length (l) of the carbon nanotubes. Preferably, the memory device can be manufactured to have a maximum electron storage efficiency of 1:w=1:1, 1:t=5:1, or 1:t=10:1. Preferably, a length (l) of each of the carbon nanotubes is 5 to 10 times greater than a width of the second electrodes. Preferably, a width (w) of the gate electrode is 5 to 10 times wider than a width of the second electrodes.

Figure 4:
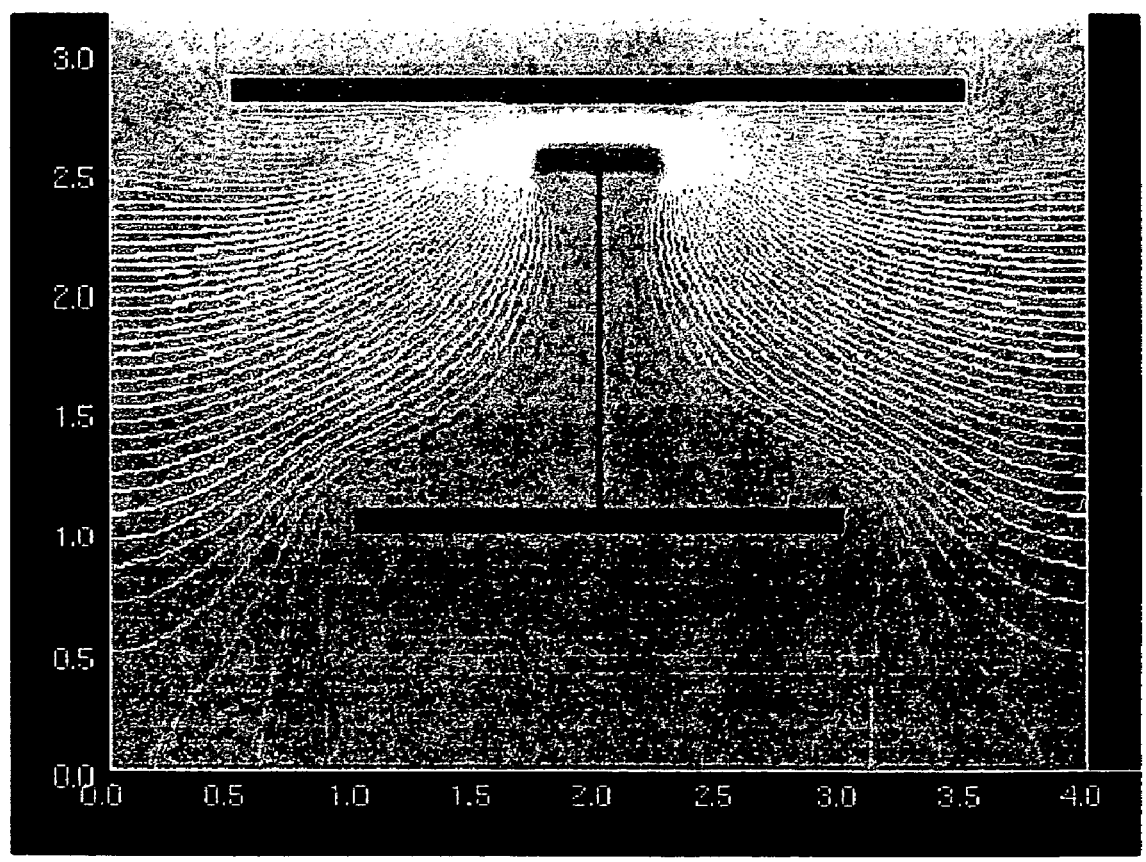
FIG. 4 shows equipotential curves in the memory device according to the first embodiment of the present invention when a predetermined voltage is applied to gate electrodes, which are arranged at intervals over drain electrons.

FIG. 4 shows equipotential curves in the memory device according to the first embodiment of the present invention when a predetermined voltage is applied to the gate electrode 17 disposed a predetermined distance apart from the upper surface of the drain electrodes 13. Here, the voltage applied to the gate electrodes 17 is 10 V.

In FIG. 4, a variation in an electric potential can be seen from the pattern of equipotential curves. The value of the electric potential increases from blue equipotential curves to red equipotential curves. Since the direction of the electric field is perpendicular to the equipotential curves, the electric field is directed to the gate electrode 17. Since the initial kinetic energy of electrons emitted from carbon nanotubes is near zero (0), the electrons are moved by the electric field. Hence, the electrons are directed to the gate electrode 17. The distribution of electrons depends on the distribution of an electric field between the gate electrodes 17 and the drain electrodes 13.

Figure 5:
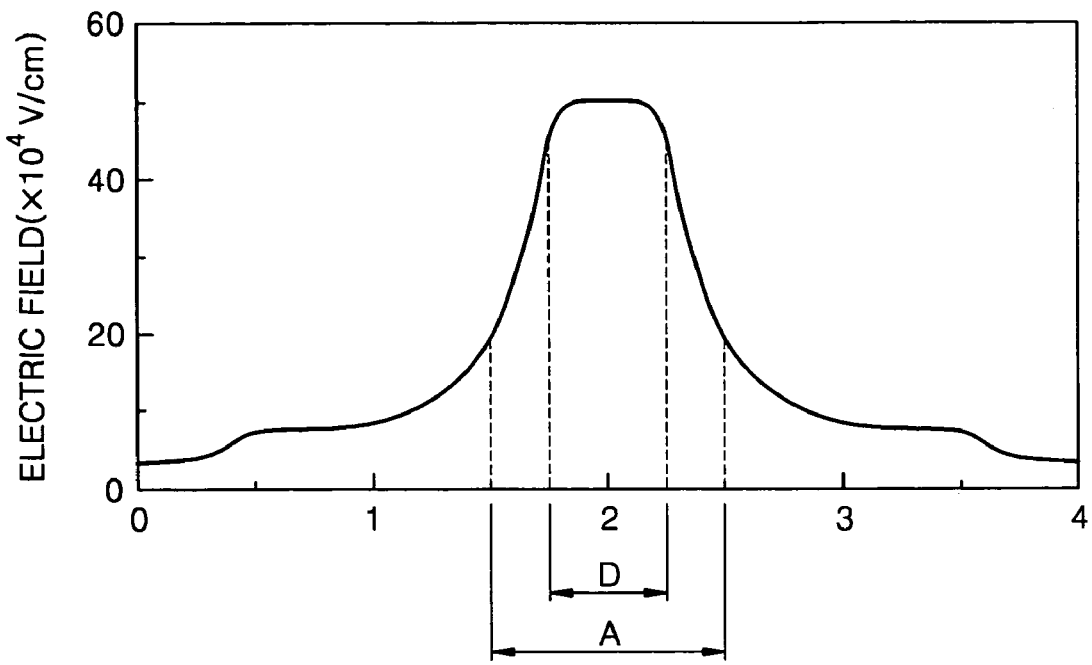
FIG. 5 is a graph showing the distribution of an electric field around drain electrodes in the memory device according to the first embodiment of the present invention.

FIG. 5 is a graph showing the distribution of an electric field around drain electrodes in the memory device according to the first embodiment of the present invention. The drain electrodes 13 are positioned in an area (D) ranging from 1.75 to 2.25 on the x-axis, and the electric field at the area (D) is no greater than $5 \times 10^5$ V/cm. As shown in FIG. 5, the intensity of the electric field decreases as a distance from the area (D) of the drain electrodes 13 increases. In addition, as shown in FIG. 5, the electric field at a portion of an area (A) ranging from 1.5 to 2.5, defined by excluding a portion screened by the drain electrodes 13 from the area (A), is relatively high, that is, $2 \times 10^5$ to $5 \times 10^5$ V/cm. Accordingly, it may be deduced from these simulation results that a strong electric field is distributed around the drain electrodes 13, and thus, many electrons are moved around the drain electrodes 13.

Figure 6:
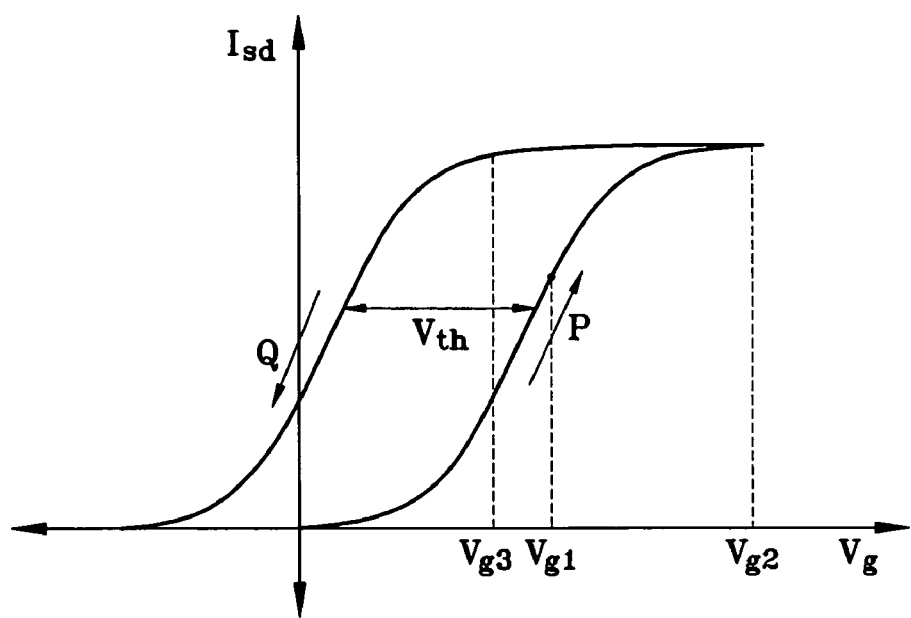
FIG. 6 is a graph showing the results of a simulation of the memory device according to the first embodiment of the present invention.

FIG. 6 is a graph diagrammatically showing a variation in a source-drain current $I_{sd}$ with respect to a gate voltage $V_g$, according to the results of a simulation of the memory device according to the first embodiment of the present invention. In the simulation, the gate electrode 17 is 100 nm×100 nm in size, a driving voltage of about 1 GHz is applied to the gate electrode 17, a current of 50 nA is emitted from the carbon nanotubes 19, and the interval between the gate electrode 17 and the drain electrodes 13 is about 30 nm. For convenience, it is assumed that all emitted electrons are trapped in the memory cell 15.

If a positive gate voltage $V_g$ is applied when the source-drain current $I_{sd}$ is zero (0), the value of the source-drain current $I_{sd}$ starts to increase in a direction P. At this time, electrons move through the carbon nanotubes 19. At $V_{g1}$, electrons start to be emitted from the carbon nanotubes 19, and the source-drain current $I_{sd}$ continuously increases. At a gate voltage greater than $V_{g1}$, the memory cell 15 can perform programming. When a gate voltage of $V_{g2}$ is applied, electrons stored in the memory cell 15 reach a saturation state. Therefore, even when a gate voltage of $V_{g2}$ or greater is applied, electrons are screened by the pre-stored electrons, and thus no further increase of the source-drain current $I_{sd}$ occurs.

To erase data recorded in the memory cell 15, the gate voltage $V_g$ is reduced. Although the gate voltage $V_g$ is reduced, emission of electrons is screened by the electrons pre-stored in the memory cell 15 until the gate voltage $V_g$ is decreased to $V_{g3}$, and thus, no decrease of the source-drain current $I_{sd}$ occurs. When the applied gate voltage $V_g$ becomes less than $V_{g3}$, the source-drain current $I_{sd}$ starts to decrease in a direction Q. Even when the gate voltage $V_g$ becomes zero (0), the source-drain current $I_{sd}$ does not become zero (0) due to the flow of electrons pre-stored in the memory cell 15. The source-drain current $I_{sd}$ flows until the gate voltage $V_g$ is decreased to a certain negative value.

The charge (Q) of electrons emitted from the carbon nanotubes 19 is calculated from the current (I) emitted from the carbon nanotubes 19 and the driving frequency (f=1/ΔT), which are both pre-set in the above-described simulation, as expressed in Equation 1:

$$Q = I \cdot \Delta T = 50 \cdot \frac{1}{2} \cdot 10^{-19} = 2.5 \times 10^{-17} \text{ Coulomb} \quad (1)$$

A capacitance (C) between the gate electrodes 17 and the drain electrodes 13 is calculated to be about $1.18 \times 10^{-17}$ F using Equation 2:

$$C = \varepsilon \frac{A}{d} = 3.54 \times 10^{-11} \times \frac{10^{-7} \times 10^{-7}}{3 \times 10^{-8}} = 1.18 \times 10^{-17} F \quad (2)$$

wherein the dielectric constant (∈) of the oxide films of the memory cell 15 is approximated to be about $3.54 \times 10^{-11}$.

A threshold voltage $V_{th}$ is calculated to be about 2.1 V by substituting Equations 1 and 2 into Equation 3:

$$V_{th} = \frac{Q}{C} = \frac{2.5 \times 10^{-17}}{1.18 \times 10^{-17}} = 2.1 \text{ V} \quad (3)$$

It may be seen from the magnitude of $V_{th}$ being 2.1 V that the memory device according to the first embodiment of the present invention has excellent memory characteristics.

The present invention provides a memory device in which electrons emitted from vertical carbon nanotubes are trapped in a memory cell, thereby achieving a highly integrated large-capacity memory device.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, carbon nanotubes can be grown in shapes other than the shapes mentioned herein.

What is claimed is:

1. A memory device using vertical nanotubes, comprising:
    an array of first electrodes arranged in strips in a first direction;
    a dielectric layer deposited on the array of first electrodes, the dielectric layer having a plurality of holes arranged therein;
    an array of nanotubes for emitting electrons, the array of nanotubes contacting the array of first electrodes and vertically growing through the plurality of holes in the dielectric layer;
    an array of second electrodes arranged in strips in a second direction on the dielectric layer, the array of second electrodes contacting the array of nanotubes, wherein the second direction is perpendicular to the first direction;
    a memory cell positioned on the array of second electrodes for trapping electrons emitted from the array of nanotubes; and
    a gate electrode deposited on an upper surface of the memory cell for forming an electric field around the array of nanotubes.

2. The memory device as claimed in claim 1, wherein the first electrodes are source electrodes, and the second electrodes are drain electrodes.

3. The memory device as claimed in claim 1, wherein the nanotubes are carbon nanotubes.

4. The memory device as claimed in claim 1, wherein the memory cell comprises:
    a first insulation film deposited on the array of second electrodes;
    a second insulation film formed below the gate electrode; and
    a charge storage film interposed between the first insulation film and the second insulation film for trapping charges emitted from the array of nanotubes.

5. The memory device as claimed in claim 4, wherein the first insulation film and the second insulation film are formed of silicon oxide.

6. The memory device as claimed in claim 4, wherein the charge storage film is formed of one of silicon and silicon nitride.

7. The memory device as claimed in claim 5, wherein the charge storage film is formed of one of silicon and silicon nitride.

8. The memory device as claimed in claim 4, wherein the charge storage film is formed of silicon nano quantum dots.

9. The memory device as claimed in claim 8, wherein the nano quantum dots have a size of several nanometers.

10. The memory device as claimed in claim 5, wherein the charge storage film is formed of silicon nano quantum dots.

11. The memory device as claimed in claim 10, wherein the nano quantum dots have a size of several nanometers.

12. The memory device as claimed in claim 1, wherein the plurality of holes is arranged in a pattern to form either a hexagonal honeycomb shape or a square shape.

13. The memory device as claimed in claim 1, wherein a length of each of the nanotubes is 5 to 10 times greater than a width of each of the second electrodes.

14. The memory device as claimed in claim 3, wherein a length of each of the nanotubes is 5 to 10 times greater than a width of each of the second electrodes.

15. The memory device as claimed in claim 1, wherein a width of the gate electrode is 5 to 10 times wider than a width of the second electrodes.

16. The memory device as claimed in claim 1, wherein the memory cell has a thickness of about 30 nm.

17. The memory device as claimed in claim 1, wherein the gate electrode is formed of either a metal or a semiconductor.

* * * * *